United States Patent
Koo

[11] Patent Number: 5,959,879
[45] Date of Patent: Sep. 28, 1999

[54] FERROELECTRIC MEMORY DEVICES HAVING WELL REGION WORD LINES AND METHODS OF OPERATING SAME

[75] Inventor: Bon-jae Koo, Incheon, Rep. of Korea

[73] Assignee: Samsung Electronics Co., Ltd., Suwon, Rep. of Korea

[21] Appl. No.: 09/052,533

[22] Filed: Mar. 31, 1998

[30] Foreign Application Priority Data

Jun. 9, 1997 [KR] Rep. of Korea ........................ 97-23659

[51] Int. Cl.⁶ .................................................. G11C 11/22
[52] U.S. Cl. ...................... 365/145; 365/185.08; 257/295
[58] Field of Search .............................. 365/145, 185.08, 365/149, 150; 357/295, 316, 410

[56] References Cited

U.S. PATENT DOCUMENTS

| | | | |
|---|---|---|---|
| 4,888,630 | 12/1989 | Paterson | 365/145 |
| 5,300,799 | 4/1994 | Nakamura et al. | 257/295 |
| 5,412,596 | 5/1995 | Hoshiba | 365/145 |
| 5,515,311 | 5/1996 | Mihara | 365/145 |
| 5,517,445 | 5/1996 | Imai et al. | 365/145 |
| 5,523,964 | 6/1996 | McMillan et al. | 365/145 |
| 5,541,871 | 7/1996 | Nishimura et al. | 365/145 |
| 5,559,733 | 9/1996 | McMillan et al. | 365/145 |
| 5,623,439 | 4/1997 | Gotoh et al. | 365/145 |
| 5,753,946 | 5/1998 | Naiki et al. | 257/295 |
| 5,768,185 | 6/1998 | Nakamura et al. | 365/145 |
| 5,822,239 | 10/1998 | Ishihara et al. | 365/145 |
| 5,822,240 | 10/1998 | Yoo | 365/145 |
| 5,856,688 | 1/1999 | Lee et al. | 257/295 |

*Primary Examiner*—David Nelms
*Assistant Examiner*—Gene N. Auduong
*Attorney, Agent, or Firm*—Myers Bigel Sibley & Sajovec

[57] ABSTRACT

Ferroelectric memory devices include a semiconductor substrate of first conductivity type having a plurality of well regions of second conductivity type therein, and a ferroelectric memory array arranged as a plurality of rows and columns of ferroelectric memory cells extending opposite the plurality of well regions. Each of the ferroelectric memory cells contains source and drain regions of first conductivity type in a corresponding well region, a floating gate extending opposite the corresponding well region and a control gate capacitively coupled by a ferroelectric material to the floating gate. A plurality of plate lines are also provided. Each of the plurality of plate lines is electrically coupled to control gate electrodes of ferroelectric memory cells in a respective row in the memory array. A plurality of bit lines is also provided. Each of the plurality of bit lines is electrically coupled to source regions of ferroelectric memory cells in a respective column in the memory array. A select line is also electrically coupled to drain regions of ferroelectric memory cells in a respective row. To enable high integration, a first word line is electrically coupled to a first well region in the plurality thereof. Accordingly, the well region of each unit memory cell acts as a separate and independently controllable electrode which receives a word line bias during programming and reading operations.

9 Claims, 3 Drawing Sheets

FERROELECTRIC MEMORY DEVICES HAVING WELL REGION WORD LINES AND METHODS OF OPERATING SAME

FIELD OF THE INVENTION

The present invention relates to integrated circuits and more particularly to integrated circuit memory devices and methods of operating integrated circuit memory devices.

BACKGROUND OF THE INVENTION

In general, dynamic random access memory (DRAM) devices can be highly integrated and have high operation speed, however, the charge stored in a capacitor of a DRAM cell as data may be lost due to leakage current. Accordingly, to prevent the loss of charge, data refresh operations are typically required. Meanwhile, static random access memory (SRAM), electrically erasable programmable read only memory (EEPROM) and flash memory typically require high operation voltages, typically have relatively low integration capability, and relatively low operation speed. However, a ferroelectric memory (FRAM) device is formed by using the physical characteristics of a ferroelectric material to store data. In the ferroelectric material, electric dipoles are arranged in the direction of an electric field when a voltage of sufficient magnitude (i.e., polarization voltage) is applied. When this occurs, data is retained as residual polarization in the ferroelectric material, even after the polarization voltage has been removed.

Ferroelectric nonvolatile memory devices are largely classified as one of two types. One type detects a change in charge stored in a ferroelectric capacitor, and another type detects a change in resistance in a semiconductor substrate due to the spontaneous polarization of the ferroelectric material. The method for detecting a change in the level of charge stored in a ferroelectric capacitor is adapted to a structure in which a unit cell is formed of one capacitor and one transistor, as a DRAM cell. Unfortunately, data may be lost when the state of the ferroelectric capacitor is read (i.e., a destructive read out occurs). The method for detecting a resistance change in a semiconductor substrate due to spontaneous polarization of a ferroelectric material is typically adapted to a metal ferroelectric metal insulator semiconductor (MFMIS) structure. In the MFMIS structure, a unit cell is typically formed of one transistor. Accordingly, the cell area is smaller than that of a DRAM having a structure of one-transistor and one-capacitor. Also, a long write period is typically not required and a nondestructive read out operation can typically be performed so that data is maintained even after being read. A switching transistor is typically required for operating a ferroelectric memory cell having a one-transistor structure. Therefore, each unit cell of the ferroelectric memory includes a memory cell transistor and a switching transistor.

FIG. 1 is a sectional view of a ferroelectric memory device having a one-transistor structure, as disclosed in U.S. Pat. No. 5,412,596. Referring to FIG. 1, a ferroelectric transistor FT containing a ferroelectric layer 4, a source region 16, a drain region 2, and a first gate region WL2a, is formed on a P-type semiconductor substrate 3. A first interdielectric layer 13 for insulating the first gate electrode WL2a of the ferroelectric transistor FT from a second gate electrode WL1a of a switching transistor ST is formed on the entire surface of the substrate. The switching transistor ST is formed on the first interdielectric layer 13 by sequentially stacking a gate insulating layer 15 and the second gate electrode WL1a. A channel region formed between the drain region 2 and the source region 16 is partially covered by the ferroelectric layer 4, and the rest thereof is covered by the second gate electrode WL1a under which the gate insulating layer 15 is interposed. The first and second gate electrodes are connected to the second and first word lines WL2a and WL1a, respectively. Drain region 2 of the ferroelectric transistor FT (or the switching transistor ST) is connected to a bit line BL, and source region thereof 16 is connected to a source line SL. Unfortunately, the unit memory cell of U.S. Pat. No. 5,412,596 requires both a ferroelectric transistor FT and a switching transistor ST, which means the unit cell size is relatively large and the relatively complicated arrangement of the cell may require complicated processing steps during fabrication.

Thus, notwithstanding the above described ferroelectric memory devices, there continues to be a need for improved ferroelectric-based memory devices that have small unit cell size and can be fabricated using relatively simple processing steps.

SUMMARY OF THE INVENTION

It is therefore an object of the present invention to provide improved integrated circuit memory devices and methods of operating same.

It is another object of the present invention to provide nonvolatile integrated circuit memory devices which can be highly integrated and methods of operating same.

It is still another object of the present invention to provide nonvolatile integrated circuit memory devices having ferroelectric memory cells therein which can be read nondestructively and methods of operating same.

These and other objects, features and advantages of the present invention are provided by integrated circuit memory devices which comprise a semiconductor substrate of first conductivity type having a plurality of well regions of second conductivity type (e.g., P-type) therein, and a ferroelectric memory array arranged as a plurality of rows and columns of ferroelectric memory cells extending opposite the plurality of well regions. Each of the ferroelectric memory cells contains source and drain regions of first conductivity type in a corresponding well region, a floating gate extending opposite the corresponding well region and a control gate capacitively coupled by a ferroelectric material to the floating gate. A plurality of plate lines are also provided. Each of the plurality of plate lines is electrically coupled to control gate electrodes of ferroelectric memory cells in a respective row in the memory array. A plurality of bit lines is also provided. Each of the plurality of bit lines is electrically coupled to source regions of ferroelectric memory cells in a respective column in the memory array. A select line is also electrically coupled to drain regions of ferroelectric memory cells in a respective row. To enable high integration, a first word line is electrically coupled to a first well region in the plurality thereof. Accordingly, the well region of each unit memory cell acts as a separate and independently controllable electrode which can receive a word line bias during programming and related operations.

According to another aspect of the present invention, a preferred method of operating a ferroelectric memory device is provided. This method includes the steps of writing a first logic value (e.g., logic 1) into the memory cell by simultaneously biasing the well region with a first word line potential (e.g., 2 Volts) and the control gate electrode with a first plate line potential (e.g., 5 Volts), to thereby establish a first write potential of sufficient magnitude across the ferroelectric dielectric layer to cause polarization of the ferroelectric dielectric layer in a first polarization state. The method also includes the steps of writing a second logic value (e.g., logic 0) into the memory cell by simultaneously biasing the well region with a second word line potential (e.g., −2 Volts) and the control gate electrode with a second plate line potential (e.g., −5 Volts), to thereby establish a second write potential of sufficient magnitude across the ferroelectric dielectric layer to cause polarization of the ferroelectric dielectric layer in a second polarization state, opposite the first polarization state. The polarization state of a ferroelectric memory cell can also be determined (i.e., "read") by applying a first read potential (e.g., 3 Volts) which is non-zero relative to a potential of the well region, to the drain region of the ferroelectric memory cell and then sensing a potential of the source region of the ferroelectric memory cell using a sense amplifier. Here, the polarization state of the memory cell is reflected as a change in resistance of the channel region caused by a change in the memory cell's threshold voltage.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
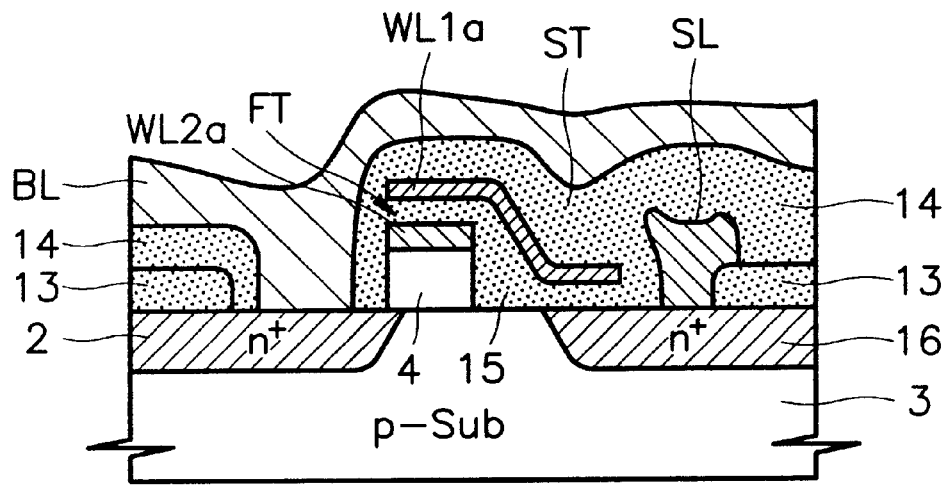
FIG. 1 is a cross-sectional illustration of an integrated circuit memory cell according to the prior art.
Figure 2:
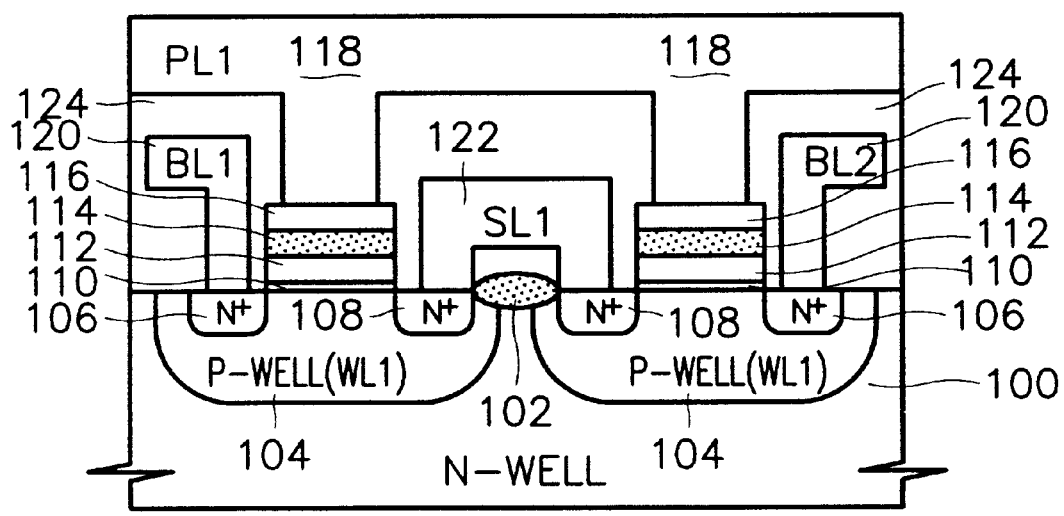
FIG. 2 is a cross-sectional illustration of a preferred integrated circuit ferroelectric memory device according to an embodiment of the present invention, taken along line 2–2' of FIG. 4.

Referring now to FIG. 2, a cross-sectional illustration of a preferred integrated circuit ferroelectric memory device according to an embodiment of the present invention, will be described. This cross-sectional illustration represents a cross-sectional view of the memory device of FIG. 4, taken along the line 2–2'. In this embodiment of FIGS. 2 and 4, a semiconductor substrate 100 of first conductivity type (e.g., N-type) is provided having a plurality of well regions 104 of second conductivity type (e.g., P-type) therein extending to a face thereof. These well regions 104 may be formed as a plurality of stripe-shaped well regions 104 which extend in parallel in the substrate 100. Field oxide isolation regions 102 may also be formed to define active portions of the semiconductor substrate 100. In each well region 104, a plurality of ferroelectric memory cells may be formed to define a column of cells in a ferroelectric memory array. Here, each ferroelectric memory cell preferably comprises a pair of source and drain regions 106 and 108, respectively, of first conductivity type (e.g., shown as N+). These source and drain regions 106 and 108 are preferably formed at spaced locations in a well region 104 and define a channel region therebetween extending adjacent the face of the substrate 100. A gate insulating layer 110 is also preferably provided to electrically insulate a floating gate electrode 112 from the well region 104. The floating gate electrode 112 comprises a first electrode of a ferroelectric capacitor. In the ferroelectric capacitor, a ferroelectric layer 114 is provided as a capacitor dielectric and a control electrode 116 is provided as a second capacitor electrode. As will be understood by those skilled in the art, the ferroelectric material may comprise a material selected from the group consisting of PZT, BST and PbTiO$_3$, although other ferroelectric materials may also be used. According to a preferred aspect of the present invention, a select line 122 (e.g., SL1) may be electrically coupled to drain regions 108 of cells in the adjacent columns. Bit lines 120 (e.g., BL1, BL2) are also preferably electrically connected to source regions 106 of memory cells in respective columns. For example, a first bit line BL1 may be electrically coupled to a plurality of source regions 106 of cells within the same column of cells and a second bit line BL2 may be electrically coupled to a plurality of source regions 106 of cells in an adjacent column of cells.

Figure 3:
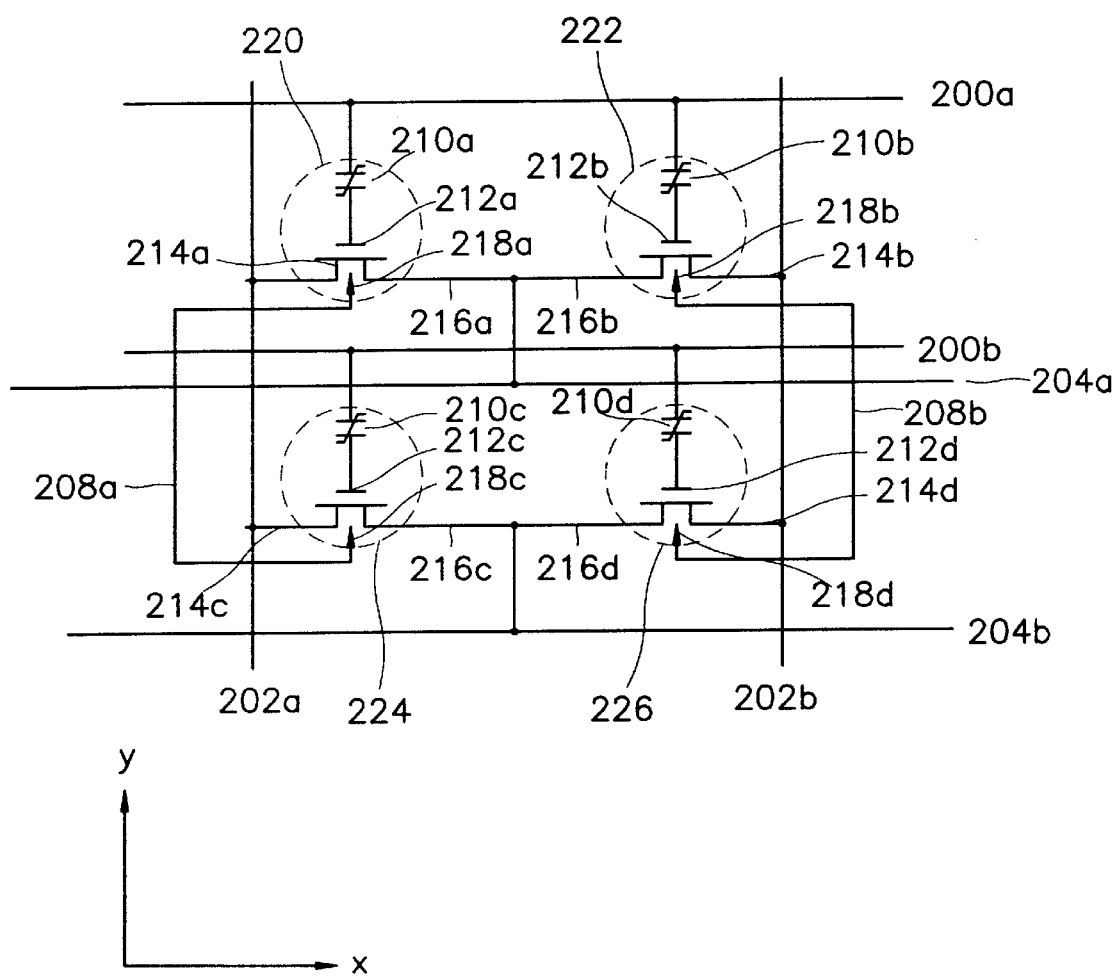
FIG. 3 is an electrical schematic of a preferred integrated circuit ferroelectric memory device according to the present invention.
Figure 4:
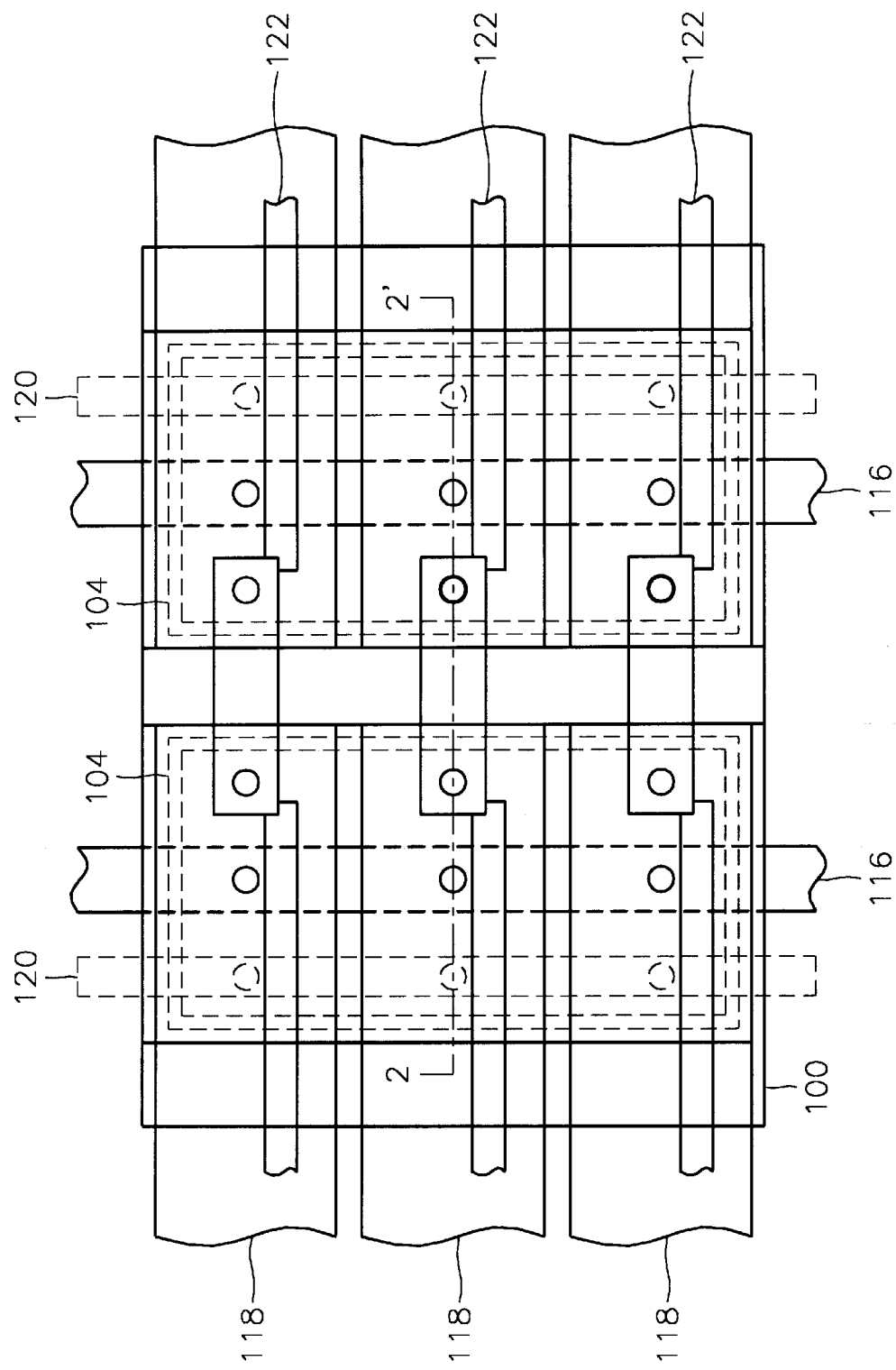
FIG. 4 is a layout schematic of the ferroelectric memory device of FIG. 3.

Referring still to FIG. 2, an electrically insulating layer 124 may also be provided as a passivation/planarization layer. Openings in the insulating layer 124 may also be formed to expose control electrodes 116 of the memory cells. A respective plate line 118 (e.g., PL1) can also be patterned to be in electrical contact with control electrodes 116 in a row of ferroelectric memory cells. Referring now to FIG. 4, a preferred layout schematic of the ferroelectric memory device of FIGS. 2 and 3 is provided. In particular, the layout schematic illustrates a portion of a preferred ferroelectric memory device containing six unit cells which span two (2) columns and three (3) rows. As illustrated, a plurality of parallel select lines 122 (SL) and parallel plate lines 118 (PL) extend horizontally (i.e., x-direction of FIG. 3) across an integrated circuit substrate. A plurality of bit lines 120 and floating gate electrodes 112 extend vertically (i.e., y-direction of FIG. 3). Rectangular N-type well regions 100 and P-type well regions 104 are also provided.

Referring now to FIG. 3, an electrical schematic of a preferred integrated circuit ferroelectric memory device will be described. In particular, FIG. 3 illustrates an arrangement of four ferroelectric memory cells 220, 222, 224 and 226 as an x-y array of cells. Cells 220 and 222 are arranged as a first row of cells which extend in the x-direction and cells 224 and 226 are arranged as a second row of cells. Cells 220 and 224 are arranged as a first column of cells which extend in the y-direction and cells 222 and 226 are arranged as a second column of cells. The memory cells 220, 222, 224 and 226 contain respective ferroelectric capacitors 210a, 210b, 210c and 210d. These ferroelectric capacitors 210a–210d have first capacitor electrodes which also comprise respective floating gate electrodes 212a–212d of the ferroelectric transistors within the cells. These ferroelectric transistors are illustrated as enhancement mode MOSFETs.

In the arrangement of FIG. 3, a pair of plate lines 200a and 200b are provided. The first plate line 200a is electrically coupled to the control gate electrodes of cells 220 and 222 and the second plate line 200b is electrically coupled to the control gate electrodes of cells 224 and 226. The control gate electrodes of cells 220, 222, 224 and 226 comprise the second capacitor electrodes of the ferroelectric capacitors 210a–210d. First and second bit lines 202a and 202b are also provided. The first bit line 202a is electrically coupled to the source regions 214a and 214c of the transistors in cells 220 and 224. The second bit line 202b is electrically coupled to source regions 214b and 214d of the transistors in cells 222 and 226. The drain regions 216a and 216b of the transistors in cells 220 and 222 are electrically coupled in common to a first select line 204a, as illustrated. In addition, the drain regions 216c and 216d of the transistors in cells 224 and 226 are electrically coupled in common to a second select line 204b. According to a preferred aspect of the present invention, the well regions 104 of FIG. 2 which correspond to substrate terminals 218a and 218c in the first column of cells in FIG. 3 and substrate terminals 218b and 218d in the second column of cells, are electrically coupled to respective word lines 208a and 208b. Here, the well regions for each column of cells can be independently biased during reading and writing operations.

This ability to independently control the potential of the well region bias enables the formation of memory arrays having high integration levels and improves the efficiency of the reading and writing operations. For example, the first memory cell 220 may be programmed with a logic 1 value by driving the first plate line 200a and the first word line 208a to "V+v" Volts and "v" Volts, respectively. Here, to cause polarization of the first ferroelectric capacitor 210a in a first polarization state, a 5 Volt bias may be applied to the first plate line 200a and a 2 Volt bias may be applied to the first word line 208a. As will be understood by those skilled in the art, these steps establish a 3 Volt potential between the channel region of the transistor in the first memory cell 220 and the second electrode of the first ferroelectric capacitor 210a. This potential is selected at a value sufficient to reverse polarization of the ferroelectric dielectric material in the first ferroelectric capacitor 210a. Likewise, the first memory cell 220 may be programmed with a logic 0 value by driving the first plate line 200a and the first word line 208a to "-(V+v)" Volts and "-v" Volts, respectively. Thus, to cause polarization of the first ferroelectric capacitor 210a in a second polarization state, opposite the first polarization state, a -5 Volt bias may be applied to the first plate line 200a and a -2 Volt bias may be applied to the first word line 208a.

As will be understood by those skilled in the art, these programming operations influence the polarization characteristics of the ferroelectric material contained in the first ferroelectric capacitor 210a and these polarization characteristics can be reflected as changes in the threshold voltage of the transistor in the first cell 220. Thus, a reading operation can be performed to determine the effective resistance of the channel region of the transistor in the first cell, under predetermined bias conditions. For example, a preferred operation can be performed to read the state of the first memory cell 220 by driving the first select line 204a to 3 Volts and driving the first and second bit lines 202a and 202b to 0 Volts and 3 Volts, respectively, and then sensing the potential of the first bit line 202a. Here, the potential of the first bit line 202a should track the potential of the first select line 204a if the effective threshold voltage of the transistor in the first cell 220 is low and the transistor is "normally on", but should hold at about 0 Volts if the threshold voltage is high and the transistor is in a "normally off" state. As will be understood by those skilled in the art, a sense amplifier can be used to detect changes in potential of the first bit line 202a during a reading operation. These operations are also represented by TABLE 1 which illustrates the values of signals applied to the schematic of FIG. 3 during operations to write data into and read data from the first cell 220.

TABLE 1

|  | Write operation | | Read operation | |
| --- | --- | --- | --- | --- |
| data | 0 | 1 | 0 | 1 |
| first word line - 208a | -v | v | 0 | 0 |
| second word line - 208 | 0 | 0 | 0 | 0 |
| first plate line - 200a | -(V + v) | V + v | 0 | 0 |
| second plate line - 200b | 0 | 0 | 0 | 0 |
| first bit line - 202a | 0 | 0 | 0 | 0 |
| second bit line - 202b | 0 | 0 | V | V |
| first select line - 204a | 0 | 0 | V | V |
| second select line - 204b | 0 | 0 | 0 | 0 |

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

a semiconductor substrate of first conductivity type having a plurality of well regions of second conductivity type therein;

a memory array arranged as a plurality of rows and columns of ferroelectric memory cells extending opposite said plurality of well regions, each of said ferroelectric memory cells containing source and drain regions of first conductivity type in a corresponding well region, a floating gate extending opposite the corresponding well region and a control gate capacitively coupled by a ferroelectric material to the floating gate;

a plurality of plate lines, each of said plurality of plate lines electrically coupled to control gate electrodes of ferroelectric memory cells in a respective row in said memory array;

a plurality of bit lines, each of said plurality of bit lines electrically coupled to source regions of ferroelectric memory cells in a respective column in said memory array;

a select line electrically coupled to drain regions of ferroelectric memory cells in a respective row; and a first word line electrically coupled to a first well region in the plurality thereof.

2. The memory device of claim 1, wherein the first word line is electrically coupled to a plurality of first well regions arranged opposite a first column of ferroelectric memory cells in said memory array.

3. The memory device of claim 1, further comprising a second word line electrically coupled to a plurality of second well regions arranged opposite a second column of ferroelectric memory cells in said memory array.

4. The memory device of claim 3, wherein said select line is electrically coupled to a drain region in one of the plurality of first well regions and a drain region in one of the plurality of second well regions.

5. An integrated circuit memory device, comprising:

a semiconductor substrate of first conductivity type having a first well region of second conductivity type therein;

a first ferroelectric memory cell on said semiconductor substrate, said first ferroelectric memory cell having a first floating gate electrode extending opposite said first well region, a first control gate electrode capacitively coupled by a first ferroelectric dielectric layer to the first floating gate electrode and first source and drain regions of first conductivity type in the first well region;

a plate line electrically coupled to the first control gate electrode;

a bit line electrically coupled to the first source region;

a select line electrically coupled to the first drain region; and a word line electrically coupled to said first well region.

6. The memory device of claim 5, further comprising:

a second well region of second conductivity type in said semiconductor substrate; and a second ferroelectric memory cell having a second floating gate electrode extending opposite the second well region, a second control gate electrode capacitively coupled by a second ferroelectric dielectric layer to the second floating gate electrode and second source and drain regions of first conductivity type in the second well region;

wherein said plate line is electrically coupled to the first and second control gate electrodes; and wherein said select line is electrically coupled to the first and second drain regions.

7. The memory device of claim 6, further comprising:

a third well region of second conductivity type in said semiconductor substrate; and a third ferroelectric memory cell having a third floating gate electrode extending opposite the third well region, a third control gate electrode capacitively coupled by a third ferroelectric dielectric layer to the third floating gate electrode and third source and drain regions of first conductivity type in the third well region;

wherein said bit line is electrically coupled to the first and third control gate electrodes; and wherein said word line is electrically coupled to the first and third drain regions.

8. In a ferroelectric memory cell containing a semiconductor well region of second conductivity type, a floating gate electrode extending opposite the well region, a control gate electrode capacitively coupled by a ferroelectric dielectric layer to the floating gate electrode and source and drain regions of first conductivity type in the well region, a method operating the ferroelectric memory cell comprising the steps of:

writing a first logic value into the memory cell by simultaneously biasing the well region with a first word line potential and the control gate electrode with a first plate line potential, to thereby establish a first write potential of sufficient magnitude across the ferroelectric dielectric layer to cause polarization of the ferroelectric dielectric layer in a first polarization state; and writing a second logic value into the memory cell by simultaneously biasing the well region with a second word line potential and the control gate electrode with a second plate line potential, to thereby establish a second write potential of sufficient magnitude across the ferroelectric dielectric layer to cause polarization of the ferroelectric dielectric layer in a second polarization state, opposite the first polarization state.

9. The method of claim 8, further comprising the step of reading a polarization state of the ferroelectric dielectric material by:

applying a first read potential which is non-zero relative to a potential of the well region, to the drain region of the ferroelectric memory cell; and sensing a potential of the source region of the ferroelectric memory cell.

\* \* \* \* \*